United States Patent
Volk et al.

(10) Patent No.: US 6,794,919 B1
(45) Date of Patent: Sep. 21, 2004

(54) DEVICES AND METHODS FOR AUTOMATICALLY PRODUCING A CLOCK SIGNAL THAT FOLLOWS THE MASTER CLOCK SIGNAL

(75) Inventors: Andrew M. Volk, Granite Bay, CA (US); Robert J. Johnston, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 239 days.

(21) Appl. No.: 09/677,116

(22) Filed: Sep. 29, 2000

(51) Int. Cl.[7] ................................................. H03K 5/22
(52) U.S. Cl. .................... 327/291; 327/294; 327/20; 327/56
(58) Field of Search ................................ 327/291, 292, 327/293, 294, 39, 42, 56, 99, 52, 147, 207, 18, 20, 544

(56) References Cited

U.S. PATENT DOCUMENTS

| | | | |
|---|---|---|---|
| 4,241,372 A | | 12/1980 | Sears ............................ 361/72 |
| 4,868,513 A | * | 9/1989 | Piercy et al. ................ 327/156 |
| 5,065,042 A | * | 11/1991 | Thomsen et al. ............ 327/295 |
| 5,406,592 A | * | 4/1995 | Baumert ....................... 375/376 |
| 5,517,109 A | * | 5/1996 | Albean et al. ............ 324/158.1 |
| 5,550,489 A | * | 8/1996 | Raab ............................. 326/93 |
| 5,557,242 A | * | 9/1996 | Wetherell ...................... 331/17 |
| 5,969,558 A | * | 10/1999 | Abe ............................. 327/292 |
| 5,978,877 A | * | 11/1999 | Strevey ....................... 710/314 |
| 6,002,274 A | * | 12/1999 | Smith et al. ................... 327/19 |
| 6,014,054 A | | 1/2000 | Kawakita et al. ............ 327/563 |
| 6,087,893 A | | 7/2000 | Oowaki et al. .............. 327/537 |
| 6,125,157 A | | 9/2000 | Donnelly et al. ............ 375/371 |
| 6,300,816 B1 | * | 10/2001 | Nguyen ........................ 327/407 |
| 6,320,406 B1 | * | 11/2001 | Morgan et al. ................ 326/14 |
| 6,323,699 B1 | * | 11/2001 | Quiet .......................... 327/108 |
| 6,329,861 B1 | * | 12/2001 | Francis ........................ 327/291 |
| 6,362,768 B1 | * | 3/2002 | Younis et al. ................ 341/155 |
| 6,407,591 B1 | * | 6/2002 | Wong et al. .................... 327/63 |

* cited by examiner

*Primary Examiner*—Timothy P. Callahan
*Assistant Examiner*—An T. Luu
(74) *Attorney, Agent, or Firm*—Fish & Richardson P.C.

(57) ABSTRACT

An electronic device such as a processor receives a master clock signal from a system clock generator. The clock signal may be single-ended or differential. The disclosure presents methods and devices for automatically producing a clock signal that follows the master clock signal, regardless of whether the master clock signal is single-ended or differential.

21 Claims, 8 Drawing Sheets

DEVICES AND METHODS FOR AUTOMATICALLY PRODUCING A CLOCK SIGNAL THAT FOLLOWS THE MASTER CLOCK SIGNAL

BACKGROUND

Many electronic devices employ clocked sequential systems. Microprocessors, for example, typically have internal state machines that change in response to a periodic clock signal. The electronic devices often do not generate the clock signal, but instead receive a master clock signal from an external clock generator. Clock signals supplied by a clock generator are of two general types: single-ended and differential. A single-ended clock signal propagates upon a single electrical channel, and periodically changes from a low voltage to a high voltage, compared to a reference voltage such as circuit ground. A differential clock signal, by contrast, propagates on two channels simultaneously, and is defined by the difference between the voltages on the two channels. A more common type of differential clock signal propagates with the voltages on the two channels having substantially the same periodic waveform but being one hundred eighty degrees out of phase with each other. In another form of differential clock signal, one channel carries a periodic signal and the other channel carries a constant reference voltage set at the mid-swing voltage of the periodic clock signal.

DETAILED DESCRIPTION

A clocked electronic device, such as a processor, may be used in different clocking systems. Some clocking systems may employ a single-ended clock. Other systems may employ a differential clock. The techniques described herein allow an electronic device to be connected to a generator supplying either kind of clocking signal. The electronic device automatically detects the kind of clocking signal being supplied, and uses the supplied clocking signal to set the device's core clock.

Figure 1:
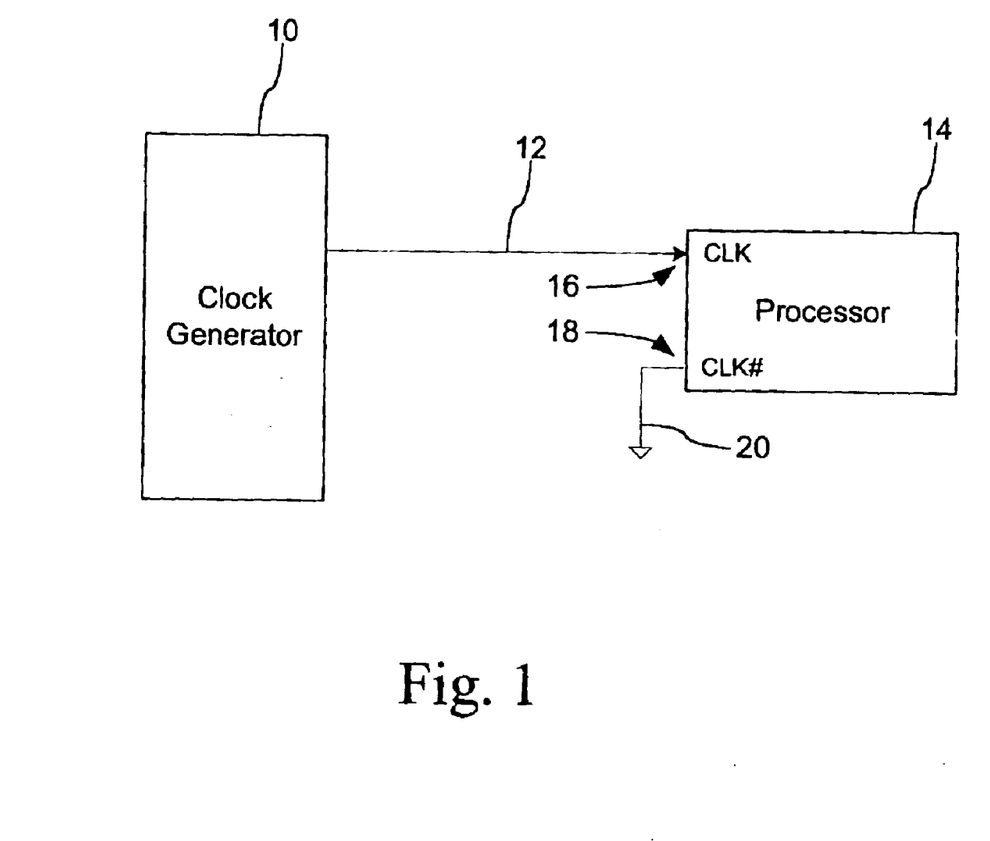
FIG. 1 is a diagram of an electronic device configured to receive a single-ended clock signal.

FIG. 1 depicts an exemplary electronic device, in this case a processor 14, configured to receive a single-ended clock signal from a clock generator 10. Processor 14 requires an external clock signal to drive its internal clocked elements; clock generator 10 supplies the clocking signal. As depicted in FIG. 1, clock generator 10 supplies a single-ended clocking signal, which propagates on a single channel 12. Typically, channel 12 carries the singled-ended clock signal and swings between a circuit ground potential and 2.5 volts. Processor 14 includes two inputs 16 and 18, designated "CLK" and "CLK#," respectively. In this configuration, the single-ended signal on channel 12 is applied to CLK input 16. Accordingly, the voltage at CLK input 16 oscillates between high and low voltage, following the master clock signal sent by clock generator 10. CLK# input 18 is connected to circuit ground 20. Accordingly, the voltage at CLK# input 18 is set to circuit ground 20 potential and does not change. CLK# input 18 may be connected to a fixed voltage other than circuit ground 20, but for convenience the techniques described below assume CLK# input 18 is connected to circuit ground 20 when the clock signal is single-ended.

Figure 2:
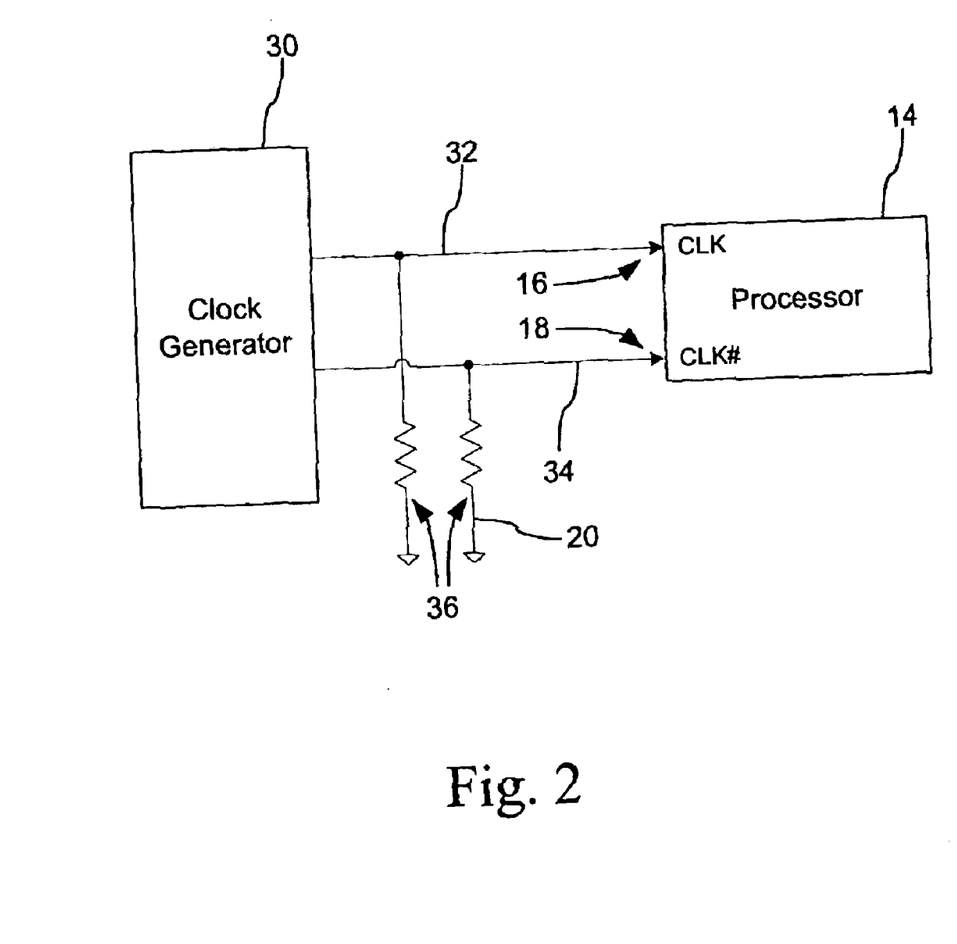
FIG. 2 is a diagram of an electronic device configured to receive a differential clock signal.

FIG. 2 shows the same processor 14 as depicted in FIG. 1 configured to receive a differential clock signal from a clock generator 30. Clock generator 30 supplies a differential clocking signal, which propagates on two channels 32 and 34. Pull-down resistors 36 may connect channels 32 and 34 to circuit ground 20. Neither channel 32 nor channel 34 is at ground potential. Typically channels 32 and 34 differ by a small voltage, such as 0.7 volts. In the more common differential clock system, channel 32 is 0.7 volts above channel 34 for one half of the clock cycle. The voltage applied to channel 32 decreases and the voltage applied to channel 34 increases, is resulting in channel 32 being 0.7 volts below channel 34 for the other half of the clock cycle. In other words, differential clock 30 produces two clock signals of a single frequency that are one hundred eighty degrees out of phase with each other. One signal is applied to CLK input 16 of processor 14 and the other signal is applied to CLK# input 18. Accordingly, the voltages at both CLK input 16 and CLK# input 18 oscillate between two potentials. When the differential clock signal includes a periodic signal and a constant reference voltage, the periodic signal is applied to CLK input 16 and the constant reference voltage is applied to CLK# input 18. An advantage of the techniques describe below is that an electronic device 14 connected to either kind of clock 10 or 30 does not need to be internally configured for the kind of clock being employed.

Figure 3:
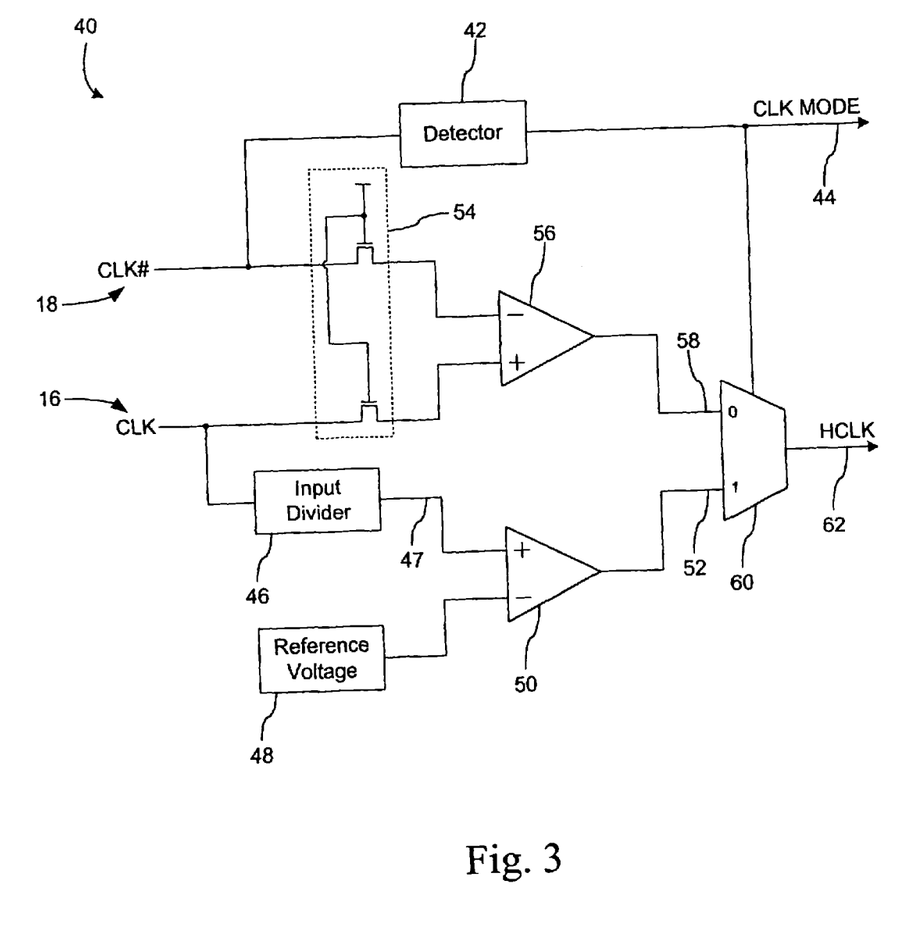
FIG. 3 is a schematic diagram of a clock signal processing system.

FIG. 3 is a circuit diagram illustrating a clock signal processing system 40 that automatically recognizes the kind of clock signal supplied. System 40 receives two inputs, CLK 16 and CLK# 18, and produces two outputs, CLK MODE 44 and HCLK 62. CLK MODE output 44 indicates the kind of clock signal, whether single-ended or differential. HCLK output 62 follows the input clock signal, regardless of whether the input clock signal is single-ended or differential. As used herein, HCLK 62 "follows" a single-ended signal by issuing a signal with a frequency identical to the signal applied at CLK input 16. HCLK 62 "follows" a differential signal by generating a signal with a frequency identical to the voltage difference between the signals applied at CLK input 16 and at CLK# input 18. As will be discussed below, HCLK signal 62 is not in phase with supplied clock signals because of delays introduced by system 40.

CLK MODE output 44 goes to a high voltage when the clock input is single-ended and to a low voltage when the clock input is differential. CLK MODE output 44 is a function of CLK# input 18. When CLK# input 18 is at constant circuit ground potential, a detector 42 detects the constant ground potential and sets CLK MODE output 44 to high voltage indicative of a single-ended clock signal. When CLK# input 18 is not constant at circuit ground potential, detector 42 sets CLK MODE output 44 to low voltage indicative of a differential signal. The details of operation of detector 42 will be discussed below.

The signals received at CLK# input 18 and CLK input 16 are supplied to a first comparator 56. Passgates 54 protect first comparator 56 from overvoltage. First comparator 56 compares the voltage of CLK# input 18 to the voltage of CLK input 16 and produces an output 58 as a function of the voltage differential. First comparator 56 produces a low voltage output 58 when the voltage at CLK# input 18 is higher than the voltage at CLK input 16, and produces a high voltage output when the voltage at CLK# input 18 is lower than the voltage at CLK input 16.

When clock signal processing system 40 is connected to a single-ended clock, and if the voltage at CLK input 16 is continually higher than the voltage at CLK# input 18, output 58 of first comparator 56 is a constant high voltage. In some circumstances, the voltage at CLK input 16 may dip near or below circuit ground, causing output 58 of first comparator 56 to change from high to low. The high intervals and the low intervals, however, are unequal. In any case, therefore, output 58 of first comparator 56 is useless as a clock signal when clock signal processing system 40 is connected to a single-ended clock. When clock signal processing system 40 is connected to a differential clock, by contrast, output 58 of first comparator 56 is a single-ended clock signal that follows the differential clock signal and is useful as a clock signal.

The voltage received at CLK input 16 may be simultaneously supplied to an input voltage divider 46, which scales down the voltage of the clock signal received at CLK input 16, producing a scaled-down clock signal 47. Input divider 46 is useful because single-ended clock signals typically swing at higher voltages relative to circuit ground 20 than the voltages needed by clock signal processing system 40. Scaled-down input voltage 47 from CLK input 16 is compared with a reference voltage 48 by a second comparator 50. Second comparator 50 produces a low voltage output 52 when scaled-down input voltage 47 is lower than reference voltage 48, and produces a high output voltage when scaled-down input voltage 47 is higher than reference voltage 48.

When clock signal processing system 40 is connected to a single-ended clock, then scaled-down input voltage 47 periodically swings above and below reference voltage 48. In such a case, second comparator 50 generates an output clock signal 52 of the same frequency as the input single-ended clock signal received through CLK input 16. Second comparator output 52 is useful as a clock signal. When clock signal processing system 40 is connected to a differential clock, however, scaled-down clock signal 47 may or may not be of sufficient magnitude to swing above and below reference voltage 48. Because differential clock signals typically involve lower voltages than single-ended signals, scaled-down input voltage 47 may not exceed reference voltage 48 at any time during the clock cycle. Consequently output 52 of second comparator 50 may not follow a differential clock signal.

Both comparator output signals 52, 58, are inputs to a multiplexer 60. Multiplexer 60 produces HCLK signal 62. CLK MODE signal 44, discussed above, acts as the control input to multiplexer 60. When a differential clock input is applied to clock signal processing system 40, then CLK MODE signal 44 is low. A low CLK MODE signal 44 causes multiplexer 60 to select signal 58 that follows a differential clock input. The selected signal is passed along as HCLK signal 62. When a single-ended clock input is applied to clock signal processing system 40, however, then CLK MODE signal 44 is high and multiplexer 60 selects signal 52 that follows a single-ended clock input.

In other words, clock signal processing system 40 includes two circuits, one for a single-ended input clock signal and one for a differential input clock signal. One circuit generates a single-ended output clock signal from a single-ended input clock signal, and the other generates single-ended output clock signal from a differential input clock signal. Multiplexer 60, based upon CLK MODE signal 44, selects the appropriate single-ended output clock signal.

The circuits shown in FIG. 3 are exemplary. FIG. 3 is not intended to show the only circuit arrangements that generate a single-ended output clock signal from a single-ended input clock signal and also generate a single-ended output clock signal from a differential input clock signal. For example, an alternate arrangement may use CLK MODE signal 44 to make a selection before comparison rather than after comparison. In this arrangement, CLK MODE signal 44 controls whether CLK input signal 16 is compared to CLK# input signal 18 or to reference voltage 48.

Figure 4A:
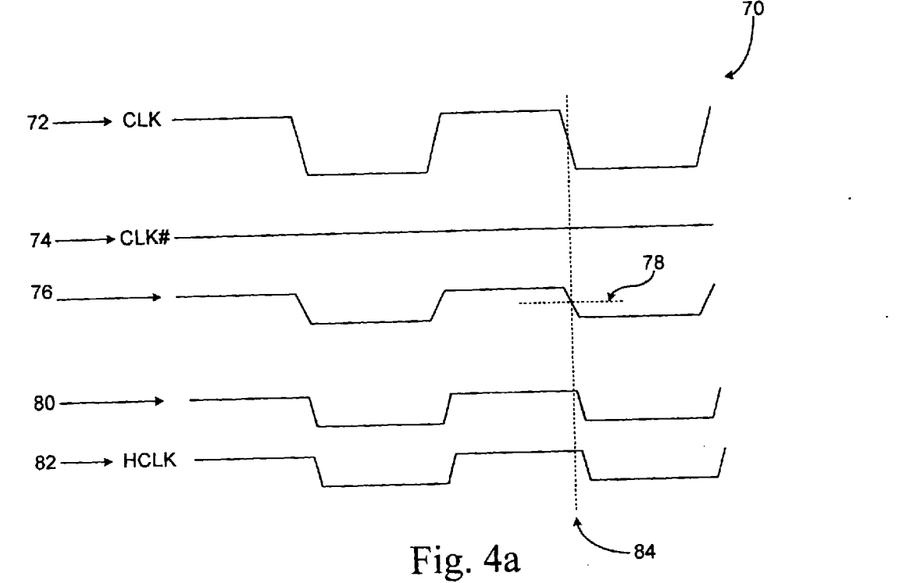
FIGS. 4a and 4b are timing diagrams.
Figure 4B:
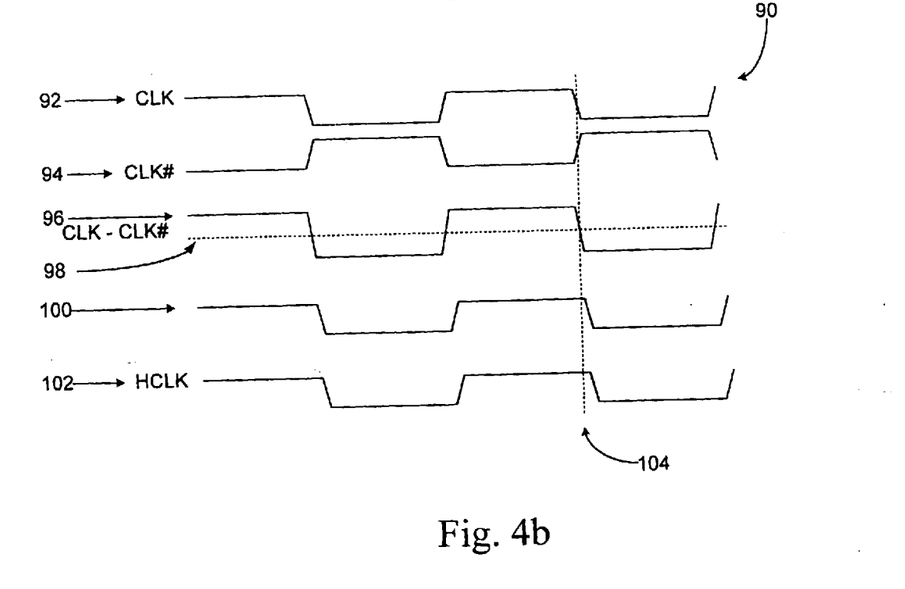

FIGS. 4a and 4b are timing diagrams that illustrate the signals in the circuit shown in FIG. 3. FIG. 4a is a timing diagram 70 for a single-ended clock input. The signal applied to CLK input 16, identified in FIG. 4a by reference numeral 72, oscillates periodically. The voltage applied to CLK# input 18, identified in FIG. 4a by reference numeral 74, is constant. Scaled-down clock signal 47 is identified by reference numeral 76 and output 52 of second comparator 50 is identified by reference numeral 80. Reference line 84 shows where the magnitude of scaled-down clock signal 76 falls below reference voltage 48, represented by reference line 78. As can be seen from reference line 84, output signal 80 has the same frequency as CLK signal 72 and scaled-down clock signal 76, but output signal 80 is out of phase with CLK signal 72 and scaled-down clock signal 76. HCLK signal 62, identified by numeral 82, likewise has the same frequency but is out of phase with CLK signal 72 and scaled-down clock signal 76. Because of delay introduced in multiplexer 60, delayed applied at CLK input 16, HCLK signal 82 is also out of phase with second comparator output signal 80.

FIG. 4b is a timing diagram 90 for a differential clock input. For purposes of illustration, the signal shown in FIG. 4b is of the type in which the channels have substantially the same periodic waveform but are one hundred eighty degrees out of phase. Accordingly, the signal applied to CLK input 16, identified in FIG. 4b by reference numeral 92, oscillates periodically, as does the voltage applied to CLK# input 18, identified by reference numeral 94. Input clock signals 92 and 94 have the same frequency but are one hundred eighty degrees out of phase. Reference line 104 shows one of the "cross points" of the differential clock signal. One cross point occurs when the voltage on the falling edge of CLK signal 92 equals the voltage of CLK# signal 94, i.e., when the difference between the signals is zero volts. Another cross point occurs when the voltage on the rising edge of CLK signal 92 equals the voltage of CLK# signal 94. Subtracting CLK# signal 94 from CLK signal 92 produces the signal identified by reference numeral 96, which periodically swings above and below zero volts, represented by reference line 98. For this reason cross points are also called "zero crossings." Output signal 58 from first comparator 56 is identified with reference numeral 100. First comparator output signal 100 is a single-ended signal that has the same frequency as input clock signals 92 and 94 and the signals' zero crossings, but is out of phase with both input clock signals and with the zero crossings. Similarly, HCLK signal 102 is a single-ended signal that has the same frequency but is out of phase with CLK signal 92, CLK# signal 94, the zero crossings and first comparator output signal 100.

In summary, HCLK signal 82, 102 is a single-ended clock signal. HCLK signal 82 follows single-ended input clock signal 72 and HCLK signal 102 follows both differential clock input signals 92 and 94 and their zero crossings. Because of delays introduced in clock signal processing system 40, however, HCLK signal 82, 102 is not in phase with the input clock signal.

Figure 5:
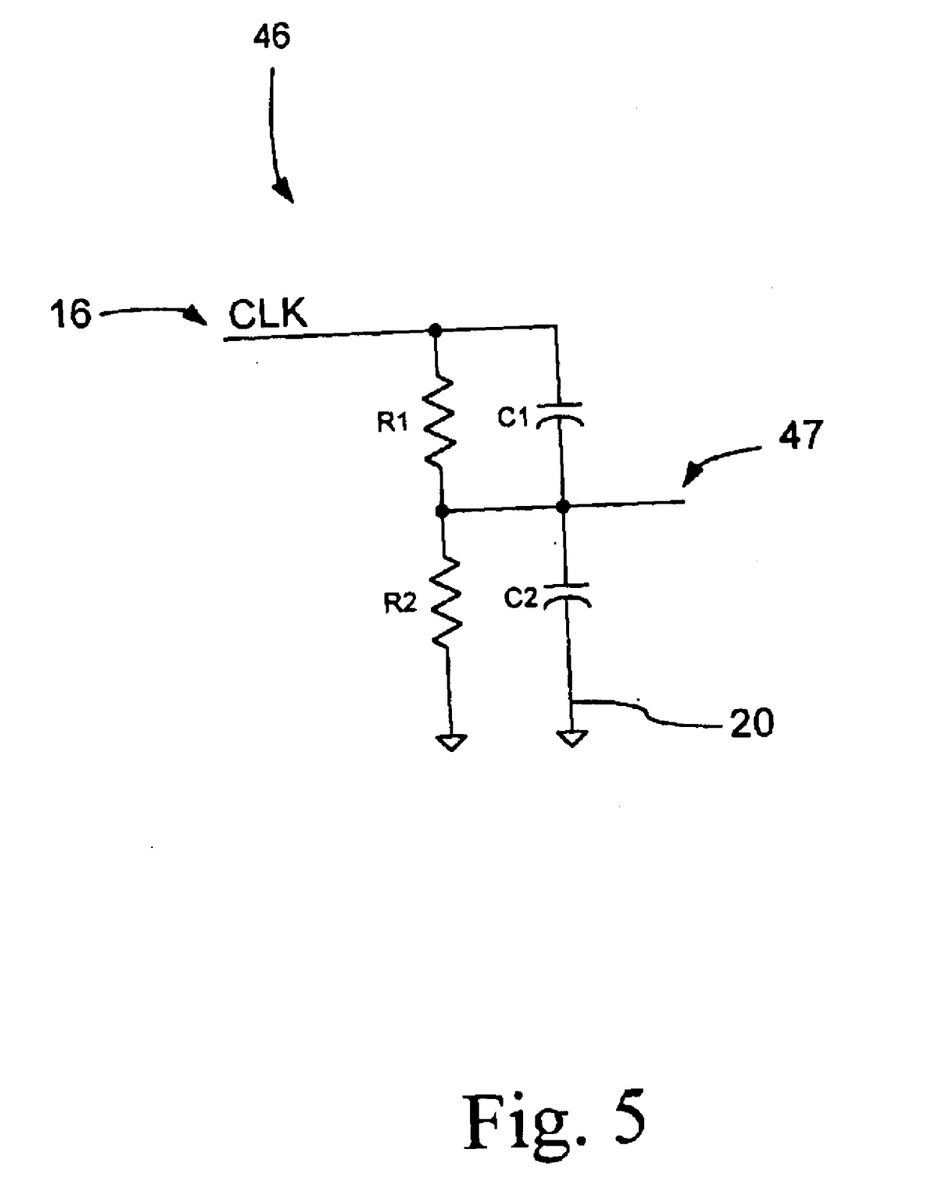
FIG. 5 is a circuit diagram of an input divider.

FIG. 5 shows an exemplary input divider 46. Input divider 46 is an RC voltage divider, which incorporates resistors R1 and R2 and capacitors C1 and C2. By selecting resistors and capacitors, CLK signal 16 can be scaled down by any suitable fraction to protect second comparator 50, which may operate at voltages lower than the clock signal supplied by the clock generator. The value of reference voltage 48 depends upon clock input voltages relative to ground potential and upon the scaling fraction selected for divider 46. Input divider 46 may be omitted when, for example, CLK signal 16 swings at voltages comparable to the supply voltage used by clock signal processing system 40.

Figure 6:
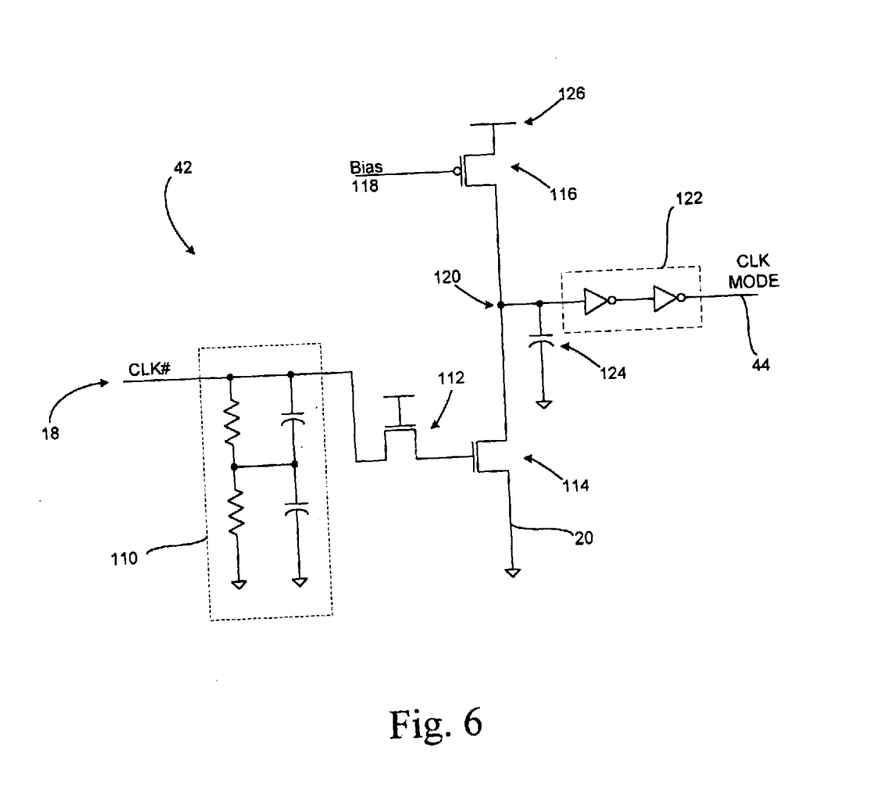
FIG. 6 is a circuit diagram of a clock mode detector.

FIG. 6 shows a clock detector 42. The input signal to clock detector 42 is CLK# input signal 18. Load matching impedance 110 at CLK# input 18 matches the input loading created by input divider 46 for CLK input 16. A passgate 112 protects detector 42 against overvoltages. CLK# input signal 18 is applied to the switching terminal of a switching transistor 114. FIG. 6 shows switching transistor 114 as a field effect transistor, with CLK# input signal 18 applied to the gate. Switching transistor 114 acts as an inverter, producing a high drain voltage 120 when the gate voltage is low, and a low drain voltage 120 when the gate voltage is high. The drain of a pull-up transistor 116 is connected to the drain of switching transistor 114. A constant bias voltage 118 is applied to the gate of pull-up transistor 116. Bias voltage 118 may be supplied by reference voltage unit 48 or by another reference voltage source (not shown). Ordinarily, bias voltage 118 is sufficient to turn on pull-up transistor 116 but causes pull-up transistor 116 to operate near its off state. In other words, pull-up transistor 116 is on, but weakly so. As will be described below, pull-up transistor 116 serves as a load to constrain drain voltage 120.

FIG. 6 shows switching transistor 114 and pull-up transistor 116 as field effect transistors. Transistors 114 and 116 may be complementary metal oxide semiconductor (CMOS) transistors. The transistors shown are exemplary and the circuits of clock detector 42 are not limited to particular kinds of transistors. Furthermore, pull-up transistor 116 is exemplary and other loads such as a resistor or an active load may be utilized to constrain drain voltage 120.

When the input to clock signal processing system 40 is single-ended, CLK# input signal 18 is at circuit ground potential 20, as shown in FIG. 1. Accordingly, the voltage applied to the gate of switching transistor 114 is at circuit ground potential 20, and the source voltage of switching transistor 114 also is at ground potential. Consequently, the gate-to-source voltage of switching transistor 114 is zero. Because the gate-to-source voltage is zero, switching transistor 114 does not turn on. Pull-up transistor 116 is on, however, and supplies a positive voltage to drain-connected node 120. Pull-up transistor 116 does not supply the positive voltage to drain-connected node 120 instantaneously, as a capacitor 124 coupled between drain-connected node 120 and circuit ground 20 requires time to charge. When capacitor 124 charges to a particular voltage, the voltage at drain-connected node 120 is sufficient to register with an output buffer 122 as a high voltage. Output buffer 122, shown as a pair of series-coupled logical inverters, produces a high voltage output 44 as a CLK MODE signal. Because CLK# input 18 remains constant at ground potential, CLK MODE signal 44 remains constant a high voltage. Thus, a CLK# input 18 indicative of a single-ended clock input, i.e., a ground potential input, produces a high voltage CLK MODE signal 44.

If the input to clock signal processing system 40 is differential, then CLK# input signal 18 is not set to circuit ground potential, but rather reaches a positive voltage. In the case where CLK# input signal 18 is periodic, the voltage swings positive periodically. In the case where CLK# input signal 18 is a constant positive voltage CLK#, input signal 18 is set to that voltage and remains constant at that voltage. In either case, the voltage applied to the gate of switching transistor 114 is sufficient to turn on switching transistor 114, driving the voltage at drain-connected node 120 low. Pull-up transistor 116, being weakly on, constrains the drain-to-source voltage of switching transistor 114 near ground potential. As a result, the voltage at drain-connected node 120 registers as a low voltage, and CLK MODE signal 44 goes low. Thus, a CLK# input 18 indicative of a differential clock input, i.e., an input above ground potential, produces a low voltage output 44.

In the case where CLK# input signal 18 periodically goes low, CLK MODE signal 44 remains low because capacitor 124 holds the voltage at drain-connected node 120 low. Capacitor 124 may begin to charge, but by making the time constant of capacitor 124 long compared to the clock cycle, the voltage at drain-connected node 120 may be kept low even when CLK# input signal 18 goes low. Capacitor 124 filters out pulses caused by the oscillations of the signal applied to CLK# input 18.

The outputs of clock signal processing system 40 include CLK MODE signal 44 and HCLK signal 62. HCLK signal 62, although following the input clock signal regardless of whether the input clock signal is differential or single-ended, is slightly out of step with the applied clock signal. The delay between an edge of input clock signal and an edge of HCLK signal 62 may be a nanosecond or two. The delay is of importance because the electronic device that includes the clock signal processing system 40 may include other clocked inputs that follow the master clock signal from the clock generator.

Figure 7:
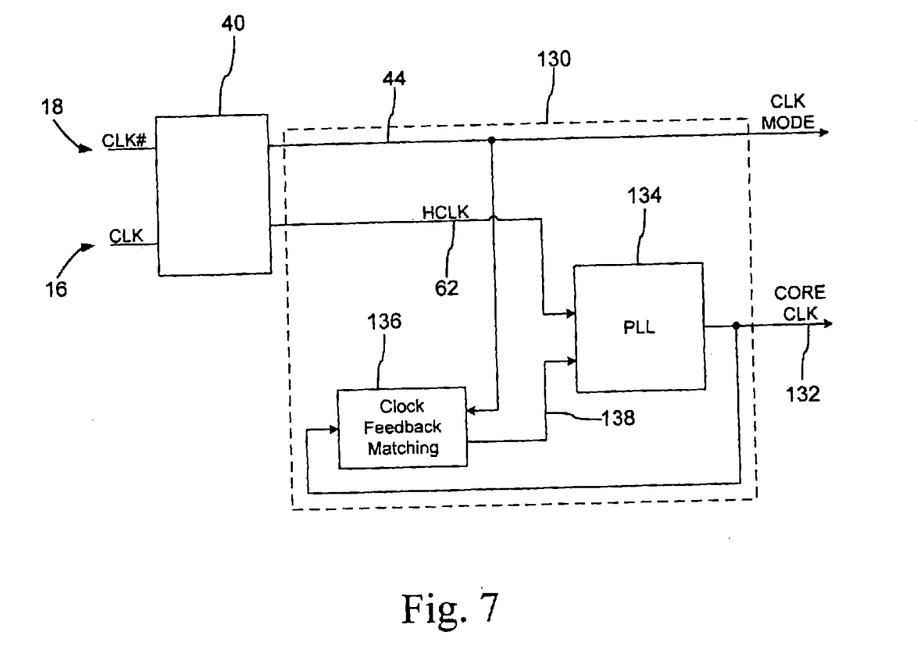
FIG. 7 is a block diagram of a compensator.

A compensator 130 shown in FIG. 7 compensates for the delay and aligns the electronic device's internal clock with the master clock signal supplied by the clock generator. The inputs to compensator 130 include CLK MODE signal 44 and HCLK signal 62, and the output is a CORE CLK signal 132, which is aligned with the signal supplied by the clock generator. In the case of a single-ended input, CORE CLK signal 132 is in phase with CLK input signal 16. In the case of a differential cock input, CORE CLK signal 132 is in phase with the zero crossings of the differential clock signal. CORE CLK signal 132 provides the clock signal used by the electronic device.

A phase-lock loop (PLL) 134 compensates for the delays. PLL 134 uses HCLK signal 62 as a reference input, and produces CORE CLK signal 132 that follows HCLK 62 and is aligned with the master clock signal. Because the differences in signal paths taken in clock signal processing system 40 for single-ended clock inputs and differential clock inputs, the delays introduced by each path may not be the same. Accordingly a clock feedback matching circuit 136 provides adjustable feedback to PLL 134, based upon the kind of input received. Clock feedback matching circuit 136 receives two inputs. The first is CORE CLK signal 132 as feedback from PLL 134, and the second is CLK MODE signal 44. The output 138 from clock feedback matching circuit 136 serves as the variable input for PLL 134. Clock feedback matching circuit 136 can use components matched to those present in clock signal processing system 40 that created the delays and may include additional delay elements. As a result, delays created in clock signal processing system 40 are cancelled out by compensator 130 and compensator 130 outputs CORE CLK signal 82 in line with the master clock signal from the clock generator. Compensator 130 may also be configured to output CORE CLK signal 132 with a known phase offset from the master clock signal.

Figure 8:
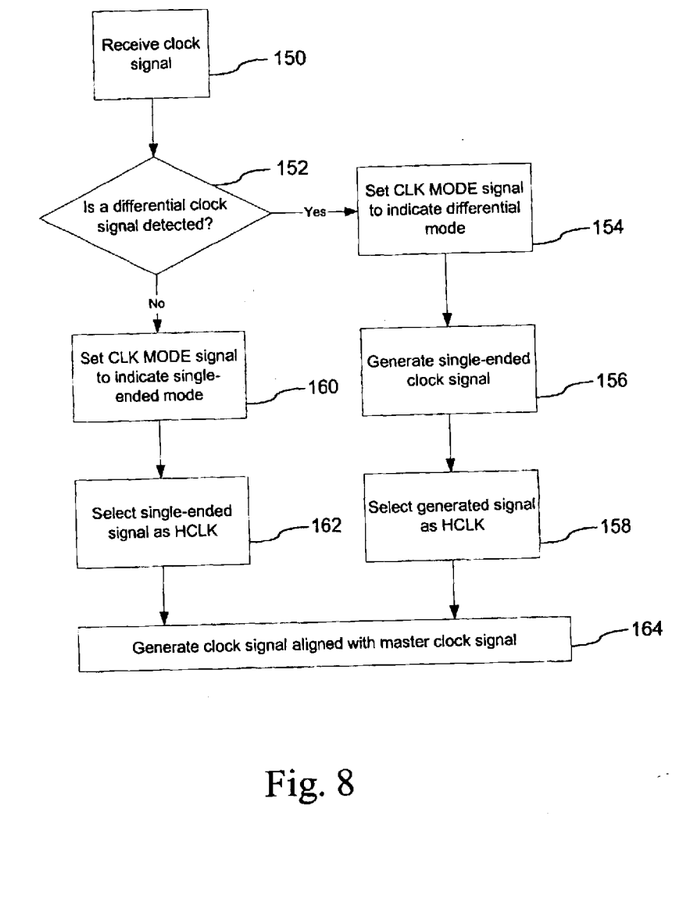
FIG. 8 is a flowchart illustrating clock signal processing.

FIG. 8 presents a flowchart illustrating clock signal processing. A clock signal is received (150) and a determination is made whether the signal is differential (152). When a differential signal is detected, CLK MODE signal 44 indicates differential mode (154). The differential signal is used to generate a single-ended clock signal 58 (156) and generated signal 58 is selected (158). When a differential signal is not detected, CLK MODE signal 44 indicates single-ended mode (160) and the single-ended signal 52 is selected (162). The selected signal 62 is used to generate a clock signal 132 aligned with master clock signal from the clock generator (164).

A number of embodiments of the invention have been described. These and other embodiments are within the scope of the following claims.

What is claimed is:

1. A method comprising:
   receiving an input clock signal representing either a differential clock signal or a single-ended clock signal;
   determining whether the input clock signal is a differential clock signal or a single-ended clock signal;
   automatically generating an output clock signal based on the determination; and
   compensating for delay between the input clock signal and the output clock signal.

2. The method of claim 1 wherein generating the output clock signal comprises generating a single-ended output clock signal when the input clock signal is determined to be a differential clock signal.

3. The method of claim 1 wherein the generated clock signal has the same frequency as the input clock signal.

4. The method of claim 1 further comprising generating a clock mode signal based on the determination.

5. The method of claim 4 wherein the output clock signal is a single-ended clock signal generated when the input clock signal is determined to be a differential clock signal.

6. The method of claim 4 wherein the generated clock signal has the same frequency as either as the first input clock signal or the second input clock signal.

7. A method comprising:
   receiving an input clock signal representing either a differential clock signal or a single-ended clock signal;
   determining whether the input clock signal is a differential clock signal or a single-ended clock signal;
   automatically generating an output clock signal based on the determining;
   wherein receiving the input clock signal comprises receiving a single-ended clock signal on a first input terminal and a ground potential on a second input terminal; and
   aligning the input clock signal and the output clock signal, wherein the aligning the input clock signal and the output clock signal comprises compensating for delay of the output clock signal.

8. A device comprising:
   a first terminal to receive a first channel of a clock input signal;
   a second terminal to receive a second channel of the clock input signal; and
   a detector coupled to the second terminal to receive the second channel of the clock input signal, wherein the detector is configured to output a clock mode signal as a function of a voltage potential of the second channel of the clock signal, wherein the clock mode signal is coupled to a clock feedback matching circuit in a clock compensator.

9. A method comprising:
   receiving an input clock signal representing either a differential clock signal or a single-ended clock signal;
   determining whether the input clock signal is a differential clock signal or a single-ended clock signal;
   automatically generating a clock mode signal based on the determination; and
   aligning the input clock signal with an output clock signal.

10. The method of claim 9 further comprising:
    providing a first circuit for a single-ended clock signal, the output of the first circuit being a first output clock signal;
    providing a second circuit for a differential clock signal, the output of the second circuit being a second output clock signal;
    selecting either the output of the first circuit or the output of the second circuit as a function of the clock mode signal.

11. A device comprising:
    a first terminal to receive a first clock input signal;
    a second terminal to receive a second clock input signal;
    a detector coupled to the second terminal to receive the second clock input signal, wherein the detector is configured to output a clock mode signal as a function of a voltage potential of the second clock signal;
    a first circuit coupled to the first terminal configured to generate a first single-ended clock signal of the same frequency as the first clock input signal;
    a second circuit coupled to the first terminal and to the second terminal to generate a second single-ended clock signal of the same frequency as the first clock input signal;
    a selector configured to select the first single-ended clock signal or the second single-ended clock signal based upon the clock mode signal; and
    a clock generator coupled at least to the first terminal, configured to output a master clock signal.

12. The device of claim 11, further comprising a compensator configured to receive the signal from either the first circuit or the second circuit and to output a core clock signal aligned with the master clock signal.

13. The device of claim 12 wherein the compensator includes a phase-locked loop.

14. The device of claim 12 wherein the compensator includes delay cancellation as a function of the clock mode signal.

15. The device of claim 14 wherein the selector is a multiplexer.

16. A method comprising:
    receiving a first periodic clock signal voltage at a first input;
    receiving at a second input one of a second periodic clock signal voltage, a constant signal voltage above ground potential or a constant ground potential signal;
    detecting whether the signal received at the second input is a constant ground potential signal;

generating a clock mode signal indicative of the detection; and coupling the clock mode signal to a clock feedback matching circuit in a clock compensator.

17. The method of claim 16 further comprising generating a high voltage clock mode signal when the signal received at the second input is a constant ground potential signal.

18. A system comprising:

a clock generator, wherein the clock generator issues one of a single-ended clock signal or a differential clock signal; and an electronic device including a first input terminal and a second input terminal, with the first input terminal coupled to the clock generator, the electronic device to generate a single-ended clock signal of the same frequency as the clock signal issued by the clock generator and aligned with the clock signal issued by the clock generator, wherein the electronic device includes a phase lock loop to compensate for delays in processing the clock generator clock signal so that the electronic device single-ended clock signal is aligned with the clock generator clock signal.

19. A system comprising:

a clock generator, wherein the clock generator issues one of a single-ended clock signal or a differential clock signal; and an electronic device including a first input terminal and a second input terminal, with the first input terminal coupled to the clock generator, the electronic device to generate a single-ended clock signal of the same frequency as the clock signal issued by the clock generator, wherein the electronic device couples the first input terminal to circuit ground when the clock generator issues a single-ended clock signal.

20. A system comprising:

a clock generator, wherein the clock generator issues one of a single-ended clock signal or a differential clock signal; and an electronic device including a first input terminal and a second input terminal, with the first input terminal coupled to the clock generator, the electronic device to generate a single-ended clock signal of the same frequency as the clock signal issued by the clock generator, wherein the electronic device first and second input terminals are coupled to the clock generator when the clock generator issues a differential clock signal, wherein the electronic device receives a clock signal at the first terminal and a clock signal at the second terminal that are one hundred eighty degrees out of phase.

21. A method comprising:

receiving a clock signal, wherein the clock signal is one of a single-ended clock signal or a differential clock signal;

processing the clock signal wherein the processed clock signal has a time delay;

generating an output single-ended clock signal that follows the received clock signal; and aligning the output single-ended clock signal with the received clock signal, wherein aligning includes compensating for the processed clock signal time delay, and wherein compensating includes providing adjustable feedback as a function of whether the received clock signal is the single-ended clock signal or the differential clock signal.

* * * * *